United States Patent [19]

Dijkshoorn

[11] Patent Number: 5,133,673
[45] Date of Patent: Jul. 28, 1992

[54] CONNECTING ELEMENT

[75] Inventor: Frank J. J. Dijkshoorn, Veghel, Netherlands

[73] Assignee: E. I. du Pont de Nemours and Company, Wilmington, Del.

[21] Appl. No.: 687,058

[22] Filed: Apr. 18, 1991

[30] Foreign Application Priority Data

Apr. 18, 1990 [NL] Netherlands .................. 9000918

[51] Int. Cl.⁵ .............................................. H01R 4/24
[52] U.S. Cl. .................................... 439/422; 439/860; 72/325
[58] Field of Search ............... 439/421, 422, 436–441, 439/860; 72/325, 326

[56] References Cited

U.S. PATENT DOCUMENTS

| | | | |
|---|---|---|---|
| 649,762 | 5/1900 | Saltzkorn et al. | 72/325 |
| 3,685,336 | 8/1972 | Black, Jr. | 72/325 |
| 4,535,519 | 8/1985 | Kajikawa et al. | 72/325 |

Primary Examiner—Joseph H. McGlynn

[57] ABSTRACT

A connecting element comprising a base plate, having contact teeth formed from the base plate by through cuts. Each of the through cuts adjoins two further through cuts to prevent tearing of the base plate. A punch is provided for both cutting the base plate and folding the contact teeth.

3 Claims, 3 Drawing Sheets

CONNECTING ELEMENT

BACKGROUND OF THE INVENTION

The invention relates to a connecting element comprising a base plate having contact teeth formed from the base plate by through cuts converging substantially on a common area, which contact teeth can be folded out of the plane of the base plate for connecting. Such a connecting element is shown, for example, in U.S. Pat. No. 4,749,368 issued Jun. 7, 1988 to Bob Mouissie and assigned to the same assignee as the present application.

In practice, connecting elements are known in which contact teeth are formed by making crosswise through cuts in a metal base plate and folding the triangular contact teeth thus formed. During folding it is possible that the base plate tears in the corners between the contact teeth, that is to say at the ends of the through cuts, which seriously weakens the base plate. In order to avoid this, according to the the application, a cross-shaped cutout is made in the base plate in a manner such that rectangular cutouts result in the corners between the contact teeth after folding. Although tearing of the base plate is prevented as a result of this, punching out a cross-shaped cutout has some disadvantages. Firstly, the length of the contact teeth is shortened by the removal of material. When such connecting elements are used for electrically contacting flexible conductors, in which case the contact teeth are bent over in a manner such that they bend back onto the flexible conductor, it is possible that the length of the contact teeth is deficient and that a good contact is consequently not obtained. Secondly, making a cross-shaped cutout in the base plate is found to result in relatively blunt contact teeth, whereas, for example to through cut through the insulation of a flexible conductor, it is desirable that the contact teeth have sharp points.

SUMMARY OF THE INVENTION

The object of the invention is to eliminate the above-mentioned disadvantages and to provide a connecting element with longer contact teeth, in which, however, the undesirable tearing of the base plate which occurs when the contact teeth are folded, is prevented. The connecting element according to the invention is for this purpose characterized in that the ends, facing away from the convergence area, of the through cuts which form a contact tooth and which each form the boundary of two adjacent contact teeth, each adjoin two further through cuts which are directed away from the common convergence area and diverge in that direction, which through cuts each form the boundary of only one contact tooth. Making two further through cuts achieves the result that the contact teeth are no longer directly adjacent to one another in the corners. The tensile stress produced by folding is now no longer concentrated in one point, as a result of which tearing is prevented.

U.S. Pat. No. 3,197,729 discloses a connecting element having tangs formed by converging through cuts, each through cut forming the boundary of two adjacent tangs. As there are no further divergent through cuts in this prior art connecting element, the tearing of the base plate in the corners between the adjacent tangs cannot be prevented when folding out the tangs.

A preferred embodiment of a connecting element according to the invention is characterized in that the two divergent through cuts each run parallel to one of the divergent through cuts forming one and the same contact tooth together therewith. This achieves the result that the ends of the through cuts are perpendicular to the (straight) folding line, as a result of which the tensile stress in the ends is minimal.

U.S. Pat. No. 3,960,430 discloses a connecting element having retaining lances formed from a base plate by through cuts, the parallel ends of which are substantially perpendicular to the folding line. However, this shape of the retaining lances was merely chosen so as to facilitate the piercing and the subsequent retaining of a flat conductor cable. As the individual retaining lances are spaced apart, the cited American patent does not address the problem of preventing the tearing of a base plate having several adjoining contact teeth.

The base plate of the connecting element according to the invention can advantageously be manufactured from an electrically conducting material, such as metal, for making electrical contact with a conductor. As a result of this, the connecting element is suitable for bringing about a mechanical as well as an electrical connection.

The connecting element according to the invention is, in particular, suitable for making contact with a flexible conductor foil. Such a conductor foil may be composed of a polyester film acting as carrier on which conductor tracks of copper or of another conducting material are applied to one or to both sides. The connecting element can be connected to the foil by sticking the contact teeth, bent over an angle of approximately 90°, through the flexible conductor film and then bending the contact teeth further in a manner such that their sharp ends pierce into a conductor track which is applied to the side of the film facing away from the base part. A good electrical connection is achieved by the points of the contact teeth penetrating the conductor track, under which circumstances further soldering is superfluous.

Of course, a connecting element according to the invention can also be used for bringing about purely mechanical connections such as connecting (metal) plates, attaching metal parts to woodwork, etc.

To manufacture a connecting element according to the aforenoted U.S. Pat. No. 4,749,368, two punches are necessary, namely one to punch out the cross-shaped pattern and one to bend over the formed contact teeth. A connecting element according to the invention can advantageously be formed with the aid of only one punch, in which case the punch both makes the through cuts and bends out the contact teeth. The punch according to the invention is provided, for this purpose, with a point having a smooth transition into a full section and is characterized by a crosssectional shape having a number of cutting edges which run outwards from the area of the point and which each turn into two mutually outwardly divergent cutting edges before reaching the full section.

The invention will be explained below with reference to the drawings.

DETAILED DESCRIPTION OF THE EMBODIMENTS

Figure 1:
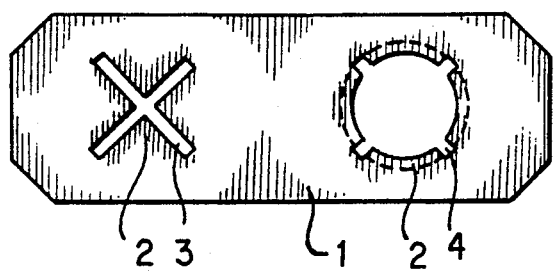
FIG. 1 shows, in plan view, a connecting element according to U.S. Pat. No. 4,749,368.

FIG. 1 shows a connecting element according to U.S. Pat. No. 4,749,368, in which, for the sake of clarity, one set of contact teeth is shown in the unfolded state. Here 1 is a metal base plate and 2 a contact tooth which is shaped like a sector of a circle and which is formed by punching the cross-shaped cutout 3 out of the base plate 1. After folding the contact teeth 2, the cutouts 4 remain in the corners between the contact teeth 2 to prevent tearing of the base plate 1. It will be clear that the cutouts 4 form part of the cross-shaped cutout 3.

Figure 2:
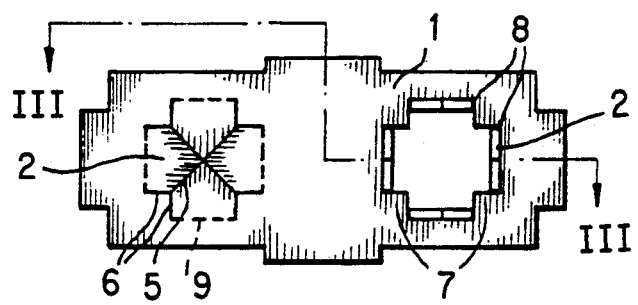
FIG. 2 shows, in plan view, a connecting element according to the invention.

FIG. 2 shows a plan view of a connecting element according to the invention in which, just as in FIG. 1, a set of contact teeth is shown in the unfolded state for the sake of clarity. Just as in the previous Figure, 1 is a base plate which, according to the preferred embodiment of the invention, is manufactured from metal. Through cuts 5 and further through cuts 6 have been made in the base plate 1 in a manner such that, after folding the contact teeth 2, the unfolded corner parts 7 remain in the plane of the base part 1 in the corners between the contact teeth 2. As a result of this, during folding the tensile stressing of the material in each corner is distributed over the points 8, as a result of which tearing of the base plate 1 is avoided. Preferably, the further through cuts 6 are made in a manner such that they are perpendicular to the line which joins their ends, that is to say perpendicular to the straight folding line 9. It is, of course, also possible to apply the further through cuts 6 at a non-right angle, for example an angle of 100°, with respect to the straight folding line 9. It should be pointed out that, as a result of folding the contact teeth 2 by means of a punch, the actual folding line may not be absolutely straight but may extend in a slightly curved manner. In this case, the further through cuts 6 are, according to the preferred embodiment, still perpendicular to the (now hypothetical) straight folding line 9, while they are at another angle with respect to the actual curved folding line.

Figure 3:
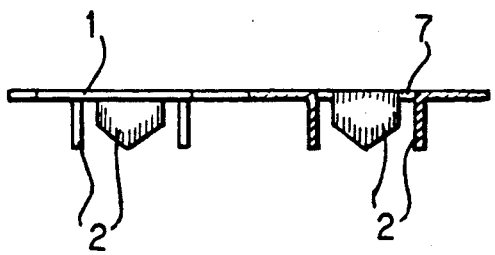
FIG. 3 shows a side elevation of a connecting element according to the invention with a partial section along the line III—III in FIG. 2.

FIG. 3 is a side view of a connecting element according to the invention, with a partial section along the line III—III in FIG. 2. In this Figure, the contact teeth 2 are shown in the folded state in which they are at an angle of approximately 90° with respect to the base part 1. Although in the Figure all the contact teeth 2 are folded to one side of the base part 1, it is of course possible to fold one group of contact teeth to one side of the base part and another group of contact teeth to another side of the base part. Within a group of contact teeth formed by one through cut pattern, some contact teeth may also be folded in the one direction and some in the other direction.

FIG. 4 shows a number of through cut patterns according to the invention, which are formed by the through cuts 5 and the further through cuts 6, the openings formed by folding the contact teeth being shown to the right of the through cut patterns. FIG. 4a shows the cut pattern according to the preferred embodiment of the invention. In this, four contact teeth 2 have been formed by four through cuts 5 converging at one point. The further through cuts 6, which form the boundary of one contact tooth, are in this case made in parallel.

Figure 4A:
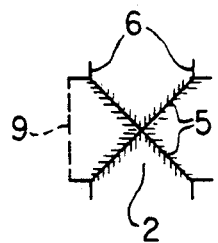
FIG. 4 shows through cut patterns for manufacturing a connecting element according to the invention.
Figure 4A:
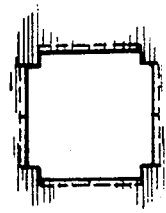
Figure 4B:
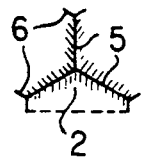
Figure 4B:
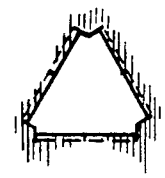
Figure 4C:
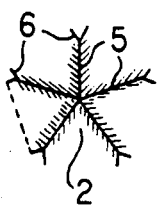
Figure 4C:
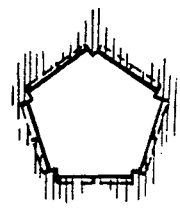
Figure 4D:
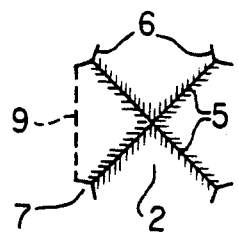
Figure 4D:
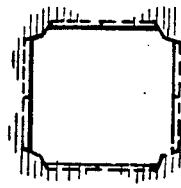
Figure 4E:
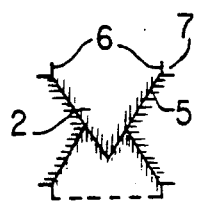
Figure 4E:
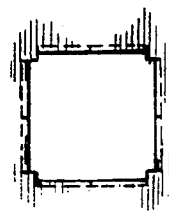

FIGS. 4b and 4c also show through cut patterns according to the invention, with in FIG. 4b three through cuts 5 converging at one point and therefore three contact teeth 2, and in FIG. 4c five through cuts 5 and five contact teeth 2. In both Figures, just as in FIG. 4a, the further through cuts 6 are made in a manner such that the two further through cuts 6 forming the boundary of one contact tooth, run parallel. As a result of this they are also perpendicular to the straight folding line 9 in the through cut patterns shown. FIG. 4d shows a through cut pattern according to the invention in which the further through cuts 6 forming the boundary of one contact tooth do not run parallel and are therefore not perpendicular to the straight folding line 9. In this case, just as in the through cut patterns mentioned previously, corner parts 7 are formed which are not folded. The angle which is formed by the two further through cuts 6, which form the boundary of the corner part 7, may in this case be either acute or obtuse and measures in the example shown 135°. FIG. 4e shows a cut pattern according to the invention in which the convergent through cuts 5 do not come together at one point. The further through cuts 6, which form the boundary of a corner part 7, have in this case a mutual angle of 90°, but other angles are of course possible. According to the invention it is also possible to combine elements of the FIGS. 4a to 4e inclusive by, for example, varying the mutual angles of the further through cuts 6 within one cut pattern.

Figure 5:
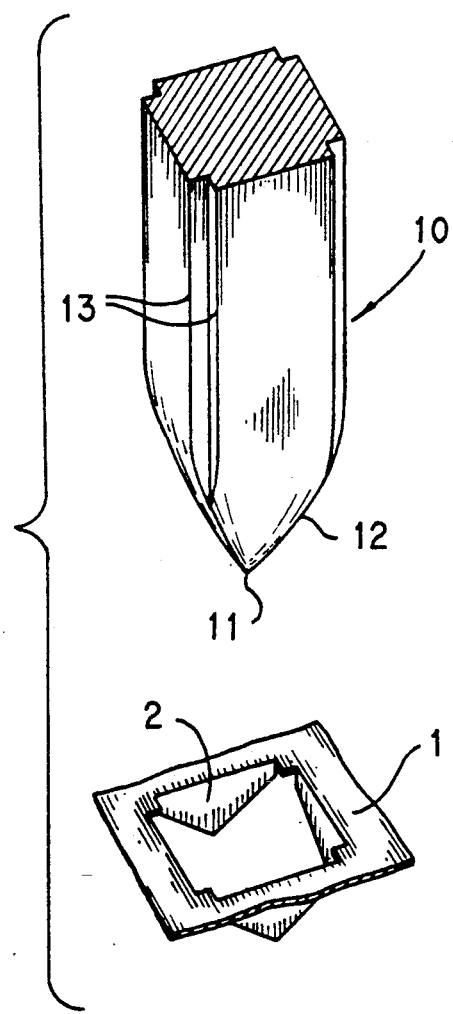
FIG. 5 shows a punch for manufacturing a connecting element according to the invention.

FIG. 5 shows in perspective a punch 10 for manufacturing a connecting element according to the invention. The punch 10 is provided with a sharp point 11 and has a number of cutting edges 12 which run outwards from the point 11 and which each turn into two outwardly divergent further cutting edges 13 before reaching the full section. It will be clear that the cutting edges 12 serve to make the through cuts 5, and that the further cutting edges 13 serve to make the further through cuts 6. With a punch of this type it is possible both to make the cut pattern and to fold the contact tooth in one operation.

I claim:

1. An electrical contact element for a flexible circuit substrate comprising a flat, strip-like base plate formed of electrically conductive material and having at least one group of contact teeth formed integrally with said base plate and projecting from one surface of said base plate, said contact teeth being adapted to pierce a flexible electrical conductor and electrically contact said conductor of said flexible circuit substrate, said group of contact teeth being foldable out of the plane of the base plate so as to project from said one surface, said group of contact teeth being defined in said plane prior to folding by a plurality of cuts through the flat base plate, said contact teeth having pointed end portions defined by a plurality of first cuts which extend radially outward from a central location, said contact teeth also having base portions defined by a plurality of pairs of second cuts, each pair of said second cuts extending outward from the end of each said first cut, said pair of second cuts being separated by an angle and defining the edges of the base portion of each tooth, the angle between each said pair of second cuts leaving between adjacent teeth a plurality of unfolded portions in the plane of said base plate, each unfolded portion having a pointed end projecting toward said central location, said unfolded portions minimizing the tensile stressing of the base plate material between said adjacent teeth during folding.

2. The electrical contact element of claim 1 wherein said angle between said pair of second cuts is approximately 90°.

3. A punch for manufacturing the electrical contact element of claim 1 and shaped so as to make all said cuts and also to fold the contact teeth to project from said one surface of the base plate, said punch having a pointed end with cutting edges for making said first cuts and having lateral surfaces with pairs of cutting edges for making said pairs of second cuts, said pairs of cutting edges being arranged so as to leave said plurality of unfolded portions in the plane of the base plate.

* * * * *